(12) United States Patent
Trinh et al.

(10) Patent No.: US 11,056,155 B1
(45) Date of Patent: Jul. 6, 2021

(54) NONVOLATILE MEMORY DEVICES, SYSTEMS AND METHODS WITH SWITCHING CHARGE PUMP ARCHITECTURES

(71) Applicant: Adesto Technologies Corporation, Santa Clara, CA (US)

(72) Inventors: Stephen Trinh, San Jose, CA (US); Duong Vinh Hao, Ho Chi Minh (VN); Nguyen Khac Hieu, Ho Chi Minh (VN); Hendrik Hartono, San Jose, CA (US); John Dinh, Dublin, CA (US); Shane Charles Hollmer, Grass Valley, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 16/447,182

(22) Filed: Jun. 20, 2019

Related U.S. Application Data

(60) Provisional application No. 62/687,350, filed on Jun. 20, 2018.

(51) Int. Cl.
| | |
|---|---|
| *G11C 13/00* | (2006.01) |
| *G11C 5/14* | (2006.01) |
| *G11C 16/26* | (2006.01) |
| *G11C 16/08* | (2006.01) |
| *G11C 16/12* | (2006.01) |
| *G11C 16/24* | (2006.01) |

(52) U.S. Cl.
CPC .............. *G11C 5/145* (2013.01); *G11C 16/08* (2013.01); *G11C 16/12* (2013.01); *G11C 16/24* (2013.01); *G11C 16/26* (2013.01)

(58) Field of Classification Search
CPC ......... G11C 5/145; G11C 16/08; G11C 16/12; G11C 16/24; G11C 16/26
USPC ...................................... 365/230.03
See application file for complete search history.

(56) References Cited

U.S. PATENT DOCUMENTS

| | | | |
|---|---|---|---|
| 6,597,603 B2 | 7/2003 | Lambrache et al. | |
| 6,794,927 B2 | 9/2004 | Bedarida et al. | |
| 7,808,300 B2 | 10/2010 | Merandat et al. | |
| 9,489,990 B1 | 11/2016 | Frulio | |
| 9,812,200 B2 | 11/2017 | Intrater et al. | |
| 10,033,268 B2 * | 7/2018 | Pan | H02M 3/07 |
| 2002/0031038 A1 * | 3/2002 | Honda | G11C 16/10 365/230.03 |
| 2004/0046681 A1 | 3/2004 | Frulio et al. | |
| 2005/0219903 A1 | 10/2005 | Daga | |
| 2010/0246282 A1 | 9/2010 | Racape | |
| 2014/0169062 A1 * | 6/2014 | Lee | G11C 13/003 365/148 |
| 2015/0348627 A1 * | 12/2015 | Taub | G11C 13/0069 365/163 |
| 2017/0012523 A1 * | 1/2017 | Pan | H02M 3/07 |

(Continued)

*Primary Examiner* — Xiaochun L Chen

(57) ABSTRACT

A memory device can include a plurality of banks, each bank including a memory cell array of nonvolatile (NV) memory cells; a plurality of charge pumps, including a first charge pump and second charge pump; and a switch circuit. The switch circuit can be configured to, in a first mode, connect the first charge pump to first circuits of the banks and isolate the second charge pump from the first circuits, and in a second mode, isolate the first charge pump from the first circuits and connect the second charge pump to the first circuits.

16 Claims, 12 Drawing Sheets

(56) References Cited

U.S. PATENT DOCUMENTS

2017/0264191 A1* 9/2017 Seo ........................ G11C 5/145
2019/0372456 A1* 12/2019 Ku ........................ H04L 9/0866

* cited by examiner (BACKGROUND)

(BACKGROUND)

(BACKGROUND)

NONVOLATILE MEMORY DEVICES, SYSTEMS AND METHODS WITH SWITCHING CHARGE PUMP ARCHITECTURES

RELATED APPLICATIONS

This application claims the benefit of U.S. Provisional Patent Application Ser. No. 62/687,350, filed Jun. 20, 2018, the contents of which are incorporated by reference herein.

TECHNICAL FIELD

The present disclosure relates generally to nonvolatile memory devices, and more particularly nonvolatile memory devices having charge pump switching architectures.

BACKGROUND

FIG. 14 is a block diagram of a conventional memory device 1401, which can include a charge pump 1403, X-path circuits 1405, Y-path circuits 1407, a read voltage regulator 1409 and high voltage (HV) switches 1411. A charge pump 1403 generates high voltages (i.e., greater than a power supply voltages) for the memory device 1401.

X-path circuits 1405 access a nonvolatile memory cell array (not shown) on a row-wise fashion in response to decoded address information. X-path circuits 1405 can use a high voltage from an output of charge pump 1403. For example, word lines may have to be driven to high voltages in various operations.

Y-path circuits 1407 access a nonvolatile memory cell array on a column-wise fashion (i.e., bit lines) in response to decoded address information. Y-path circuits 1407 can also use a high voltage from an output of charge pump 1403. For example, select gates are driven to "overdrive" voltages to ensure no voltage drop occurs as data are output and/or input to a nonvolatile memory cell array.

A read voltage regulator 1409 can generate a read voltage from an output provided by charge pump 1409. A read voltage is used to read data from nonvolatile memory cells. High voltage (HV) switches 1411 can switch various generated HV voltages to appropriate circuits of the memory device 1401.

The conventional memory device 1401 can provide adequate performance at relatively higher power supply levels or lower operating speeds. However, as power supply levels are reduced and/or operating speeds increased, the operation of conventional memory device 1401 can be adversely impacted.

As but one example, during high speed read operations an output of charge pump 1403 can "droop" (i.e., fall below a desired minimum level). This can occur as X-path circuits 1405 and Y-path circuits 1407 are switching from one address (i.e., byte address) to another, and thus affect the integrity of read data (e.g., insufficient gate overdrive to pass high sensed current/voltage). In addition, such a droop can result in read voltage regulator 1409 providing an inaccurate read voltage, which can also result in the sensing of erroneous read data. Such a droop in charge pump voltage can be related to a frequency of the charge pump 1403 versus a frequency of read operations, a strength of the charge pump 1403, a capacitance (i.e., de-bounce capacitance) at an output of the charge pump 1403, and the integrity of an internal power supply of the memory device 1401.

While a strength of a charge pump can be increased to address possible droop, such a modification can require a considerable increase in integrated circuit area, resulting in larger die size and thus larger cost.

FIG. 15A is a block diagram of another conventional memory device 1501. Memory device 1501 can include a charge pump 1503, voltage regulators 1509-1/2, and memory banks 1513-1/2. Using the output from charge pump 1503, voltage regulator 1509-1 can provide one or more regulated high voltages to bank 1513-1 and voltage regulator 1509-2 can provide one or more regulated high voltages to bank 1513-2.

The conventional memory device 1501 can provide adequate performance when accesses occur to memory banks 1513-1/2 one at a time. However, when two memory banks 1513-1/2 are accessed at the same time, erroneous operations can occur. As but one example, to increase memory device performance 1501, it is desirable to enable a read-while-write (RWW) operation, where data from one memory bank can be read, while the other memory bank is undergoing a program (or erase) operation. However in a conventional device, a RWW operation can result in a read "disturb", which can result in erroneous read data being output from a memory bank.

FIG. 15B is a timing diagram showing a read disturb operation in conventional memory device 1501. At time t0, a program (or erase) operation can be initiated in a first memory bank (BANK1). As a result, a charge pump 1503 can generate one or more high program voltages (Vprog) for use in BANK1 for the program/erase operation. Once Vprog is at a sufficient level, nonvolatile memory cells in BANK1 can be programmed (or erased).

At time t1, a read operation can be initiated in a different bank (BANK2). As a result, one or more high read voltages (Vread) for use in BANK2 can be generated from the output of charge pump 1503.

At time t2, Vread is at a sufficient level and data from memory cells in BANK2 can be read. However, because voltage regulators 1509-1 and 1509-2 are coupled to the same charge pump output node 1515, the charging and discharging of high voltage nodes during the program/erase operation can result in variations in Vread. Such variations can result in errors in read data. It is noted that such a disturb may also occur in the opposite fashion, with read operations in bank 1513-2 disturbing program/erase operations in bank 1513-1. However, such an effect can be masked by automatic verify operations of the memory device 1501, which can automatically reprogram/re-erase memory cells when a program/erase operation was not successful. However, such reprogram/re-erase operations can add to program/erase times, increase wear in memory cells, and consume additional power.

It would be desirable to provide some way of addressing the various drawbacks of conventional nonvolatile memory devices noted above.

DETAILED DESCRIPTION

Figure 1:
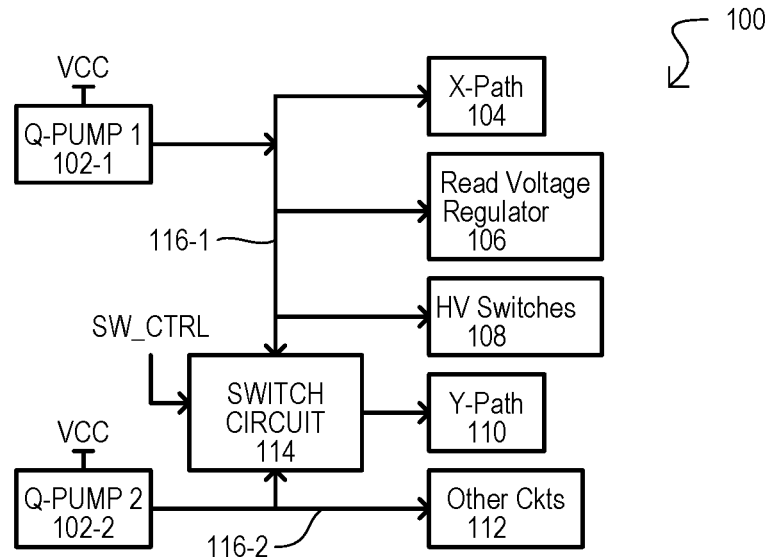
FIG. 1 is a block diagram of a memory device according to an embodiment.

Embodiments described herein can include nonvolatile memory devices, systems and methods that enable switching between different charge pumps to isolate high voltage nodes from one another to eliminate or reduce disturb and other adverse effects.

In some embodiments, a charge pump which is used to generate a high voltage in one type of operation (e.g., program/erase operations) can be dynamically switched to generate a high voltage for certain circuits in another type of operation (e.g., read operations).

In some embodiments, a nonvolatile memory device can include multiple charge pumps, each connected to a memory bank. In some configurations, the charge pumps can have outputs connected together, providing a single pool from which high voltages can be generated for the memory banks. However, in other configurations, charge pumps for different banks can be isolated from one another, thus preventing variations in the high voltage one bank from disturbing the high voltage of another bank.

In the various figures shown below, like items are referred to with the same reference numerals but with the leading digit(s) corresponding to the figure number.

FIG. 1 is a block diagram of a nonvolatile memory (NVM) device 100 according to an embodiment. NVM device 100 can include NV memory cells (not shown), which can store data in a nonvolatile fashion. Data can be read from NV memory cells in read operations, and data can be written to NV memory cells in write operations. In some embodiments, write operations can include erase operations, which can set all memory cells to one particular value (e.g., logic 0) and program operations which can selectively set memory cells to another value (e.g., logic 1). NV memory cells can be of any suitable type or form, as will be described in more detail herein.

NVM device 100 can include a first charge pump 102-1, a second charge pump 102-2, X-path circuits 104, a read voltage regulator 106, high voltage (HV) switches 108, Y-path circuits 110, other circuits 112, and a switch circuit 114. A first charge pump 102-1 can receive a power supply voltage (VCC) and generate a voltage having an absolute magnitude greater than VCC (i.e., a high voltage) at a first pump node 116-1. Similarly, a second charge pump 102-2 can receive VCC and generate a voltage having an absolute magnitude greater than VCC at a second pump node 116-2. In some embodiments, high voltages generated from first and second charge pumps 102-1/2 can be positive values. However, in some embodiments, one or both HVs can be negative values. Voltages generated by first and second charge pumps 102-1 and 102-2 can be the same or can be different. Further, one or both charge pumps 102-1/2 can vary operations to provide a greater or smaller charge capacity in response to control values (not shown). As but a few of many possible examples, a charge pump speed can be varied, or additional capacitance can be switched in or out, or a number of stages can be switched in or out.

While each charge pump can receive power from a power supply (VCC), such a power supplies are not necessarily the same power supply. For example, some memory devices can have different power supplies for different sections (i.e., an I/O power supply).

X-path circuits 104 can access a nonvolatile memory cell array (not shown) in a row wise manner in response to input values, such as address values. X-path circuits 104 can take any form suitable for the type of nonvolatile memory cell array being accessed. In particular embodiments, X-path circuits 104 can include global X-decoder circuits, local X-decoder circuits, group bit line selectors, and word line selectors. A high voltage generated by use of first charge pump 102-1 can be applied to any number of X-path circuits 104 according to the architecture of the NVM device 100.

A read voltage regulator 106 can generate a read voltage from a high voltage provided by first charge pump 102-1. A read voltage can be used in read operations to the nonvolatile memory cell array. In particular embodiments, a read voltage can be applied to bit lines to generate a read current that varies according to a memory cell state (e.g., programmed or erased). High voltage (HV) switches 108 can switch various generated high voltages generated with first charge pump 102-1 to different sections of NVM device 100.

Other circuits 112 can include one or more circuits of NVM device 100 that can receive a high voltage in one mode, but not in another mode. Other circuits 112 can be connected directly, or by way of another switch circuit (not shown) to an output of second charge pump 102-2. In some embodiments, other circuits 112 can be include program circuits for generating and/or applying a program (or erase) voltage to the nonvolatile memory cell array.

Y-path circuits 110 can access a nonvolatile memory cell array in a column direction in response to input values, such as address values. Y-path circuits 110 can take any form suitable for the type of nonvolatile memory device. In particular embodiments, Y-path circuits 110 can include one or more hierarchies of Y-select circuits, which can couple selected bit lines to input and/or output lines of the NVM device 100. In particular embodiments, Y-path circuits 110 can include three levels of Y-select circuits. Y-path circuits 110 can receive a high voltage and apply it Y-path circuits 110.

Switch circuit 114 can be connected between Y-path circuit 110 and the first and second charge pumps 102-1/2. In response to control values (SW_CTRL), a switch circuit 114 can be configured into two or more different states. Such states can include a first state in which first pump node 116-1 is connected to Y-path circuits 110, while second pump node 116-2 is isolated from Y-path circuits, and a second state in which first pump node 116-1 is isolated from Y-path circuits 110, while second pump node 116-2 is connected to Y-path circuits.

In particular embodiments, in a program operation to the nonvolatile memory cell array, control values (SW_CTRL) can place switch circuit 114 in the first state. Thus, X-path circuits 104, a read voltage regulator 106, and Y-path circuits 110 can have high voltages derived from first charge pump 102-1. Second charge pump 102-1 is isolated from Y-path circuits 110 and can generate voltages for other circuits/purposes (e.g., generate a program or erase voltage). In a read operation to the nonvolatile memory cell array, control values (SW_CTRL) can place switch circuits 114 in the second state. Thus, Y-path circuits 110 can have a high voltage derived from second charge pump 102-2 and can be isolated from first charge pump 102-1. Once a read operation is complete, control values (SW_CTRL) can return switch circuit 114 to the first state.

Figure 2:
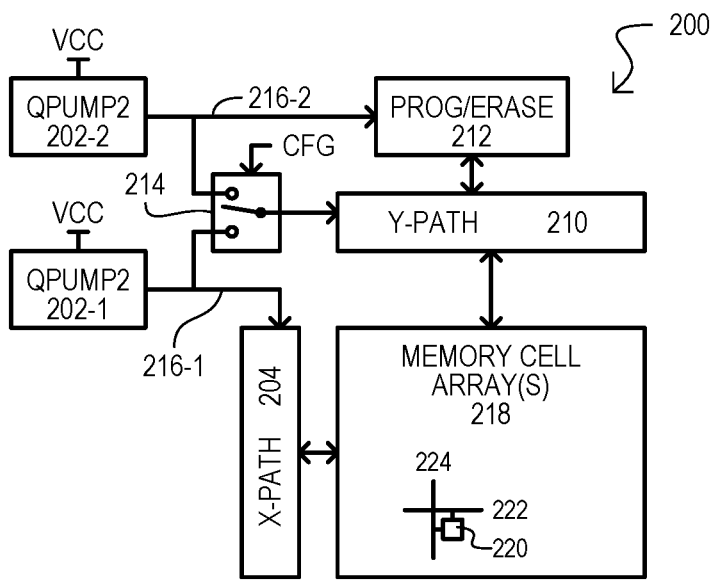
FIG. 2 is a block diagram of a memory device according to another embodiment.

FIG. 2 is a block diagram of a memory device 200 according to another embodiment. A memory device 200 can be one implementation of that shown in FIG. 1. A memory device 200 can include a first charge pump 202-1, a second charge pump 202-2, X-path circuits 204, Y-path circuits 210, program/erase circuits 212, switch circuits 214, and memory cell array(s) 218. First and second charge pumps 202-1/2 can take the form of any of those described herein or equivalents. First charge pump 202-1 can have a first pump node 216-1 connected to switch circuit 214 and X-path circuits 204. Second charge pump 202-2 can have a second pump node 216-2 connected to program/erase circuits 212 and switch circuit 214.

X-path circuits 204 and Y-path circuits 204/210 can take the form of any of those shown herein or equivalents and can provide access to memory cell array(s) 218. X-path and Y-path circuits 204/210 can receive high voltages (e.g., voltages having an absolute magnitude greater than a power supply voltage of the memory device) generated by first and/or second charge pumps 202-1/2.

Program/erase circuits 212 can receive a high voltage value from second charge pump 202-2 and generate a program or erase voltage for application to memory cell array 218. While FIG. 2 shows program/erase circuits 212 connected to Y-path circuits 210, program/erase circuits 212 could be applied to memory cell array 218 via various other inputs depending on the type of nonvolatile memory cells and array architecture (e.g., can be applied to source lines, or "plate" structures formed over multiple cells, etc.).

A memory cell array(s) 218 can include a number nonvolatile memory (NVM) cells, one shown as 220, arranged into one or more arrays. Each memory cell 220 can be connected to a word line 222 and bit line 224. Connections to bit lines and/or word lines can be direct or by other structures, such as other memory cells, as but one example. Memory cell array(s) 218 can have higher level decoding structures, such as global word lines, which can be connected to multiple (local) word lines and/or global bit lines, which can be connected to multiple (local) bit lines. A memory cell array 218 can also be subdivided into separately accessible portions (e.g., banks). NVM cells 220 can be of any suitable type, including but not limited to, EEPROM type cells that include a floating gate or charge storing dielectric (e.g., SONOS), resistive RAMs including those functioning according to an oxidation-reduction type reactions (e.g., oxygen vacancy/occupation dielectric, CBRAMs), magneto-resistive RAMs (MRAMs), phase-change RAMs (PCRAMS), and ferro-electric RAMs (FRAMs).

A memory cell array(s) 218 can have any suitable architecture. As a few of many possible examples, a memory cell array 218 can have a NOR flash type architecture, a NAND flash type architecture, a RAM type architecture, or combinations thereof.

A switch circuit 214 can alternately connect Y-path circuits 210 to first pump node 216-1 or second pump node 216-2 according to configuration values CFG.

Example operations will now be described.

A switch circuit 214 can initially be in a default state. In the default state, configuration values CFG can cause switch circuit 214 to connect Y-path circuits 210 to first pump node 216-1. Thus, high voltages for X-path and Y-path circuits 204/210 can be generated with first charge pump 216-1 and not second charge pump 216-2.

In a program or erase operation, configuration values CFG can remain unchanged. However, program/erase circuits 212 can generate high voltages for program and erase operations with second charge pump 202-2. At the same time, high voltages for X-path and Y-path circuits 204/210 can be generated with first charge pump 202-1.

In a read operation, configuration values CFG can cause switch circuit 214 to connect Y-path circuits 210 to second pump node 216-2, while isolating Y-path circuits 210 for first pump node 216-1. As a result, high voltages for the Y-path circuits 210 can be generated by use of second charge pump 202-2 and not first charge pump 202-1. At the same time, high voltages for the X-path circuits 204 can be generated by use of first charge pump 202-1.

It is noted that a memory device 202 can include voltage regulators for regulating high voltages generated by charge pumps 202-1/2. Such regulator can be located within other circuits (e.g., X-path circuits 204, Y-path circuits 210, program/erase circuits 212) or be located in charge pumps 202-1/2.

Further, while FIG. 2 shows only three circuits (204, 210, 212) receiving charge pump voltages, a memory device 200 can include various other circuits that receive and use a high voltage generated by one or both charge pumps 202-1/2.

Figure 3:
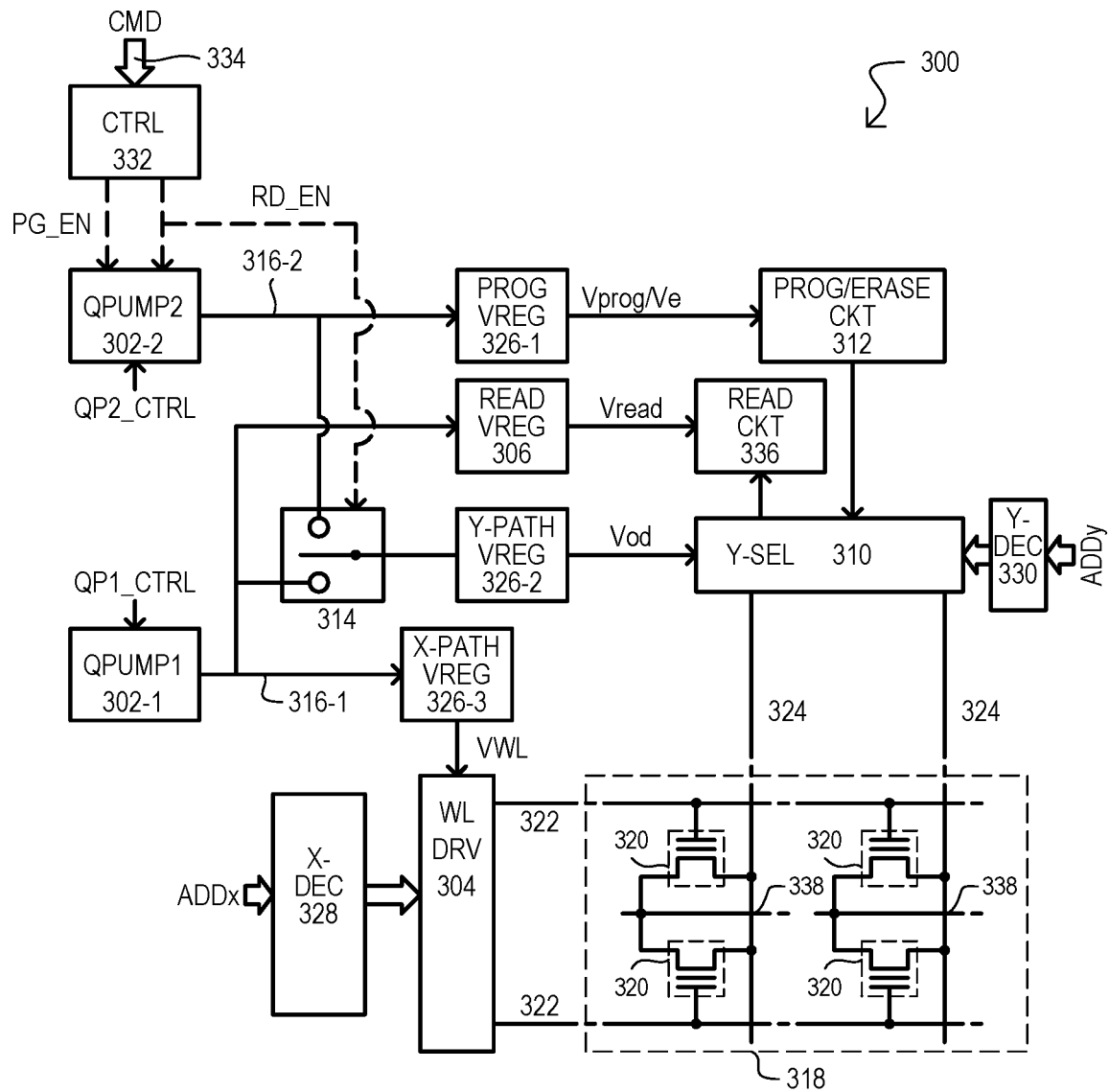
FIG. 3 is a block diagram of a memory device according to another embodiment.

FIG. 3 is a block diagram of a memory device 300 according to another embodiment. A memory device 300 can be one implementation of either of those shown in FIG. 1 or 2. A memory device 300 can include a first charge pump 302-1, a second charge pump 302-2, word line driver (WLD) circuits 306, a read voltage regulator (VREG) 306, Y-select circuits 310, program/erase circuits 312, a switch circuit 314, a memory cell array 318, program/erase VREG 326-1, a Y-path VREG 326-2, an X-path VREG 326-3, X-decoder 328, Y-decoder 330, command decode 332, and read circuits 336.

First and second charge pumps 302-1/2 can take the form of any of those described herein or equivalents. First charge pump 302-1 can generate a high voltage in response to control values QP1_CTRL, which include an enable signal as well as pumping signal, which can be a periodic signal in some embodiments. First charge pump 302-1 can generate a high voltage on first pump node 316-1, which can be provided to read VREG 306, switch circuit 314 and X-path VREG 326-3.

Second charge pump 302-2 can generate a high voltage in response to control values QP2_CTRL, which include an enable signal as well as pumping signal. In addition, second charge pump 302-2 can be enabled by signals PG_EN and RD_EN. Second charge pump 302-2 may generate a voltage that is the same or different than that of the first charge pump 302-1. Further, second charge pump 302-2 may or may not have the same driving (i.e., current) capacity as the first charge pump 302-2. Second charge pump 302-2 can generate a high voltage on second pump node 316-2, which can be provided to program/erase VREG 326-1 and switch circuit 314.

Switch circuit 314 can selectively connect first or second pump nodes 316-1/2 to a Y-path VREG 326-2 in response to signal RD_EN.

Program/erase VREG 326-1 can receive a high voltage at second pump node 316-2 and regulate it to generate a regulated program or erase voltage Vprog/Ve, which can be provided to program/erase circuits 312. Read VREG 306 can receive a high voltage at first pump node 316-1 and regulate it to generate a regulated read voltage Vread, which can be provided to read circuits 336. Y-path VREG 326-2 can receive a high voltage from the first or second pump node 316-1/2, by operation of switch circuit 314, and regulate it to generate an overdrive voltage Vod for Y-select circuits 310. X-path VREG 326-3 can receive a high voltage at first pump node 316-1 and regulate it to generate a regulated word line voltage (VWL), which can be provided to WLD circuits 304. It is understood that any or all voltage regulators (306, 326-1 to -3) can provide voltages that are stepped-down from that provided at their respective pump node (316-1/2).

X-decoder 328 can decode a portion of an address value (ADDx) received by memory device 300 to select word lines for selecting a word line for WLD circuit 304. WLD circuit 304 can drive selected word lines with VWL provided by X-path VREG 326-3. Y-decoder 330 can decode a portion of address values (ADDy) received by memory device 300 to enable a data input/output (I/O) path by operation of Y-select circuits 310. Based on inputs from Y-decoder 330, Y-select circuits 310 can apply Vod received from VREG 326-2 to Y selection paths.

A memory cell array 318 can be a NOR type EEPROM array having memory cells 320 connected to bit lines 324, word lines 322 and source lines 338. By operation of WLD circuits 304 and Y-select circuits 310 memory cells 320 can be selected for read, program and erase operations.

Command decode circuits 332 can decode commands (CMD) received at an input 334 to memory device 300. In the embodiment shown, such decoding can include the activation of the PG_EN signal in response to a program operation and the activation of the RD_EN signal in response to read operation.

Having described various sections of a memory device 300, selected operations of the memory device will now be described.

In response to a command (CMD) indicating a program or erase operation, command decode circuit 332 can activate signal PG_EN. In response to the active PG_EN signal, second charge pump 302-2 can start to generate a high voltage. Signal RD_EN can be inactive, thus switch circuit 314 can connect first pump node 316-1 to Y-path VREG 326-2. As a result, high voltages Vread, Vod and VWL can be generated using first charge pump 302-1, while program/erase voltage Vprog/Ve can be generated using second charge pump 302-2.

In response to a command (CMD) indicating a read operation, command decode circuit 332 can activate signal RD_EN, while signal PG_EN can be inactive. As a result, second charge pump 302-2 can start to generate a high voltage. In addition, because signal RD_EN is active, switch circuit 314 can connect second pump node 316-2 to Y-path VREG 326-2. As a result, high voltages Vread, and VWL can be generated using first charge pump 302-1, while high voltage Vod can be generated using second charge pump 302-2.

Figure 4A:
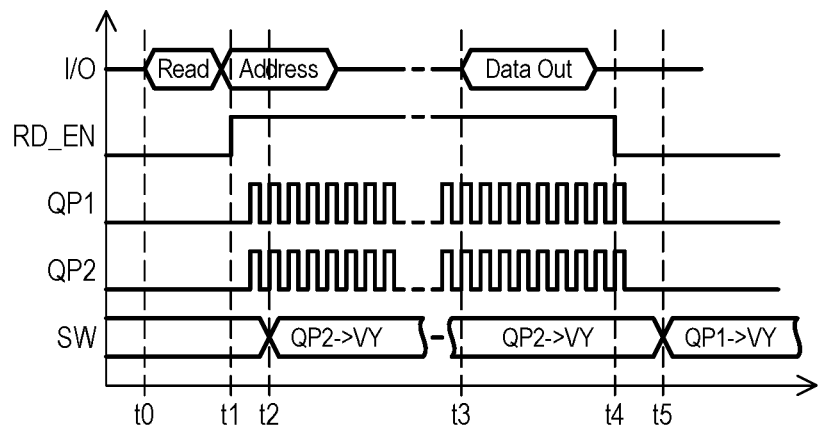
FIGS. 4A to 4C are timing diagrams showing operations of memory devices according to embodiments.
Figure 4B:
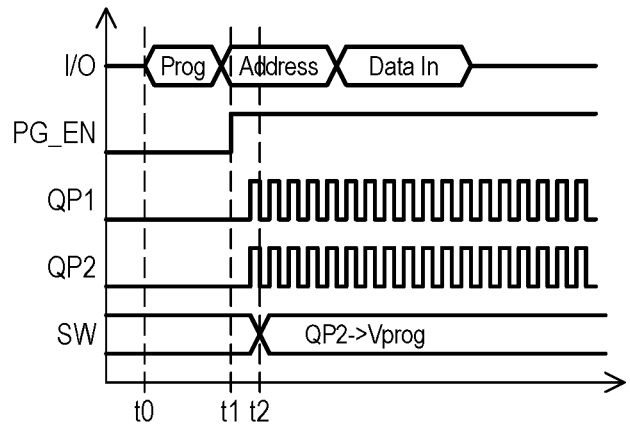
Figure 4C:
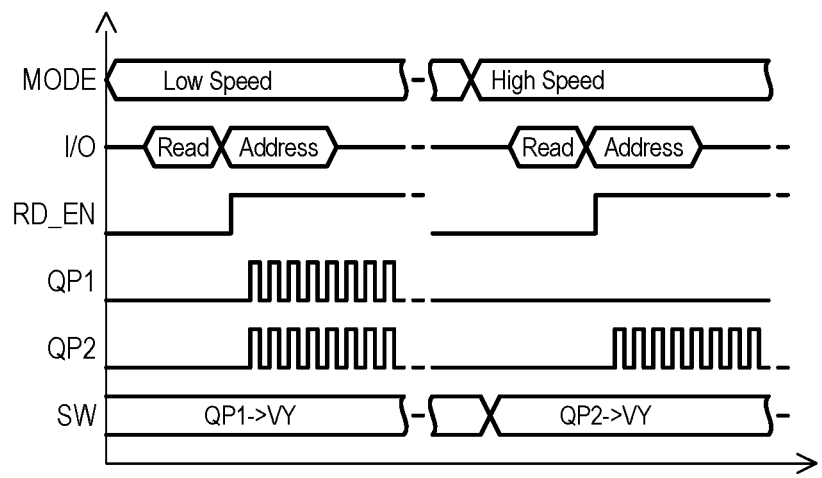

FIGS. 4A to 4C are timing diagrams showing the initiation of various operations in a memory device according to embodiments.

FIG. 4A is a timing diagram of a read operation and includes the following waveforms: I/O, which shows control and data inputs to a memory device; RD_EN which shows a read enable signal; QP1 which shows the state of a first charge pump; QP2 which shows the state of a second charge pump; and SW, which shows the state of switching circuits.

Referring still to FIG. 4A, at about time t0, a read operation can be initiated by application of a read command at inputs to the memory device. In the embodiment shown, a read command can include or be followed by a read address.

At about time t1, in response to the read command, a RD_EN can be activated (transition high in this example). At about the same time, QP1 and QP2 can be activated (indicated by periodic waveform).

At about time t2, switch circuits can establish state QP2→VY, which indicates a second charge pump can be connected to Y-path circuits (while a first charge pump is isolated from Y-path circuits). Switch circuits may or may not have been in the QP2→VY state prior to time t2.

At about time t3, data for the corresponding read operation can be output from the memory device.

At about time t4, a read operation can end, and RD_EN can transition to an inactive state.

At about time t5, after the read operation is complete, switch circuits can establish state QP1→VY, which indicates a first charge pump can be connected to Y-path circuits (while the second charge pump is now isolated from Y-path circuits).

In this way, in response to a read operation, a second charge pump QP2 can be switched in to provide a high voltage to Y-path circuits. Thus, the same charge pump does not need to service both X-path and Y-path circuits.

FIG. 4B is a timing diagram of a program operation and includes waveforms I/O, QP1, QP2 and SW, which can represent the same signal/operations as FIG. 4A. Unlike FIG. 4A, FIG. 4B includes a waveform PG_EN which shows a program/erase enable signal.

Referring still to FIG. 4B, at about time to, a program or erase operation can be initiated by application of a program or erase command at inputs of the memory device. In the embodiment shown, a program/erase command can include or be followed by an address. Further, in the case of a program operation, write data (Data In) can also be included.

At about time t1, in response to the program or erase command, a PG_EN signal can be activated (transition high in this example). At about the same time, QP1 and QP2 can be activated (indicated by periodic waveform).

At about time t2, switch circuits can establish state QP2→Vprog, which indicates a second charge pump can be connected to program/erase circuits. Switch circuits may or may not have been in the QP2→Vprog state prior to time t2.

In this way, a memory device can dynamically switch charge pump assignments according to type of access operation (e.g., program/erase versus read).

While embodiments may include memory devices that switch charge pump assignments according to operation, embodiments may also include memory devices that switch charge pump assignment based on mode. As but one example, in higher power or lower speed modes, no charge pump switching may be needed, as charge pumps may provide sufficient charge for all operations and/or current draws may be less frequent or otherwise less severe. However, in higher speed or low power modes, charge pump switching can be employed to leverage all available charge pumps for necessary tasks. FIG. 4C is a timing diagram of one such embodiment.

FIG. 4C includes the same waveforms as FIG. 4A. However, FIG. 4C also includes a waveform showing a mode of operation MODE. As shown, in a first mode (Low Speed), charge pumps are not switched. Thus, switch circuits maintain a same configuration QP1→VY. However, in another mode (High Speed), charge pumps can be switched, to enable available charge pumps to handle other tasks. Thus, switch circuits switch to a state QP2-VY.

While FIGS. 4A to 4C show the initiation of memory device operations according to some embodiments, such embodiments should not be construed as limiting. Operations can be initiated in any suitable fashion according to the interface of the memory device. As but a few of many possible example, read and write (e.g., program, erase) addresses can be received with read or write commands (e.g., an address bus/line separate from command bus/line). Similarly, write data can be received with a write command (e.g., a data bus/line separate from command bus/line). Further, any suitable switching can occur based on different modes or operations.

While embodiments can include memory devices and systems where charge pumps can be selectively applied to particular circuits, other embodiments can include switching circuits for isolating charge pumps from one another, to ensure that operations of one circuit do not disturb operations of other circuits connected to the same charge pump node. An example of such an embodiment is shown in FIG. 5.

Figure 5:
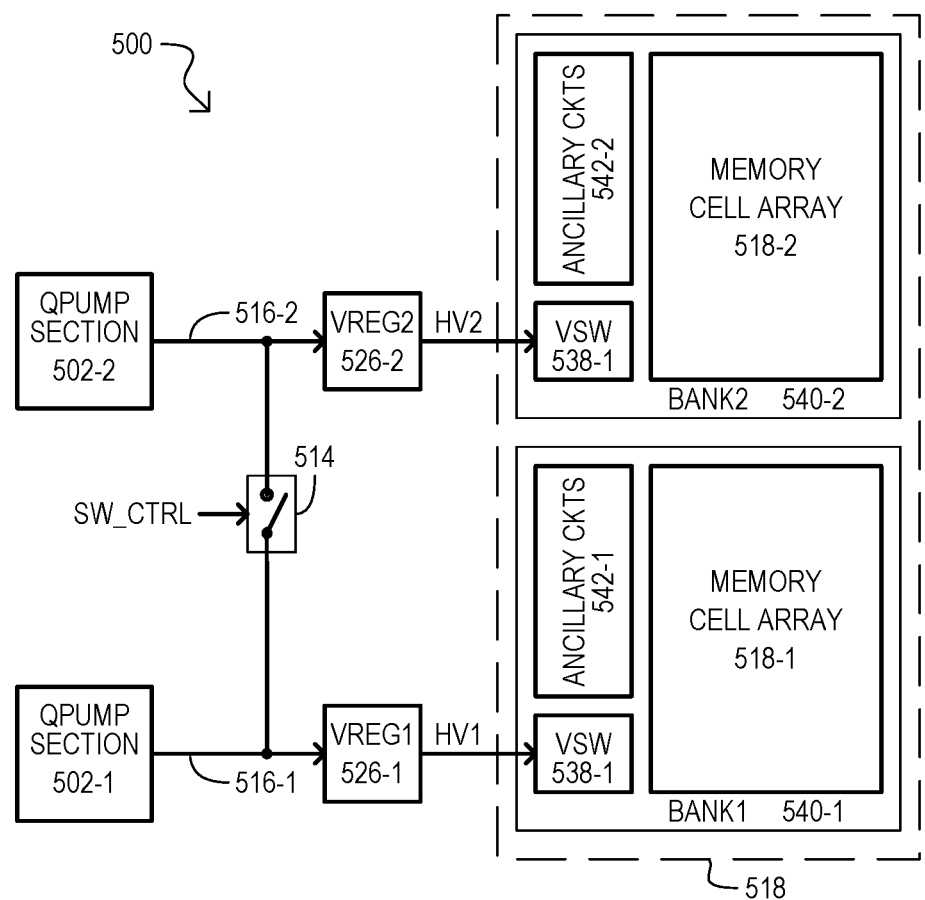
FIG. 5 is a block diagram of a memory device according to another embodiment.

FIG. 5 is a block diagram of a memory device 500 according to another embodiment. A memory device 500 can include charge pumps connected to different sections of the memory device that can be selectively isolated from one another. A memory device 500 can include a first charge pump 502-1, a second charge pump 502-2, switch circuits 514, a first voltage regulator 526-1, a second voltage regulator 526-2 and a memory cell array 518.

First and second charge pumps 502-1/2 can take the form of any of those described herein or equivalents. First charge pump 502-1 can generate a high voltage at first pump node 516-1 and second charge pump 502-2 can provide a second high voltage at a second pump node 516-2.

A first voltage regulator (VREG1) 526-1 can be connected to first pump node 516-1 and can generate a first regulated high voltage HV1 from the voltage provided at the first pump node 516-1. A second voltage regulator (VREG2) 526-2 can be connected to second pump node 516-2 and can generate a second regulated high voltage HV2 from the voltage provided at the second pump node 516-2.

Switch circuit 514 can selectively connect or isolate first and second pump nodes 516-1/2 from one another in response to a switch control value SW_CTRL. Accordingly, in one configuration, switch circuit 514 can short first and second pump nodes 516-1/2, and VREG1 526-1 and VREG2 526-2 can generate HV1 and HV2 from the same node (i.e., shorted pump nodes 516-1/2). However, in another configuration, switch circuit 514 can isolate first and second pump nodes 516-1/2, and VREG1 526-1 can generate HV1 from first pump node 516-1 and not second pump node 516-2, while VREG2 526-2 can generate HV2 from second pump node 516-2 and not first pump node 516-1. Thus, operations using HV1 will not disturb HV2, and vice versa.

Memory cell array 518 can include a first bank 540-1 and a second bank 540-1. Each bank 540-1/2 can include a memory array portion 518-1/2, ancillary circuits 542-1/2, and voltage switch circuits 538-1/2. Memory array portions 518-1/2 can each include a number of memory cells, which can take the form of any of those described herein or equivalents.

Ancillary circuits 542-1/2 can include circuits for executing various operations on their corresponding memory array portion 518-1/2, including read and write (e.g., program, erase) operations, as described herein and equivalents. Thus, ancillary circuits 542-1/2 can vary considerably according to the architecture of memory array portion 518-1/2. In some embodiments, ancillary circuits 542-1/2 can include X-path circuits, Y-path circuits, program/erase circuits, read circuits, etc.

Voltage switch circuits 538-1/2 can receive regulated high voltages from a VREG 526-2/1 and provide them to selected portions the corresponding bank 540-1/2, including ancillary circuits 542-1/2.

Banks 540-1/2 can be separately accessible at the same time. That is, while an operation is occurring in one bank (e.g., program/erase), a different operation can occur in another bank (e.g., read).

By enabling the isolation of pump nodes 516-1/2 by switch circuit 514, simultaneous operations can occur in different banks, without causing disturb conditions that could otherwise arise from a charge pump node shared among multiple banks.

Particular operations of the memory device 500 will now be described.

Memory device 500 can receive instructions for a program or erase operation to be performed in a first bank 502-1. Switch circuit 514 can short pump nodes 516-1 and 516-2. In addition, first charge pump 502-1 can be active, enabling HV1 to be provided by VREG1 to the first bank 502-1. Second charge pump 502-2 could also be active at this time. The first bank 502-1 can use HV1 (which may be a program/erase voltage) to execute the program/erase operation.

While memory device 500 continues to execute the program/erase operation in first bank 540-1, memory device 500 can receive instructions for a read operation to be performed in a second bank 502-2. Switch circuit 514 can isolate pump nodes 516-1 and 516-2. In addition, if only first charge pump 502-1 was active, second charge pumps 502-2 can be activated. In this arrangement, HV1 can continue to be provided by VREG1 to the first bank 502-1, but at the same time, HV2 can be provided by VREG2 to the second bank 502-1. Further, because switch circuits 514 isolate first pump node 516-1 from second pump node 516-2, the program/erase operations in the first bank 540-1 will not disturb the read operations in the second bank 540-2, and vice versa.

Figure 6:
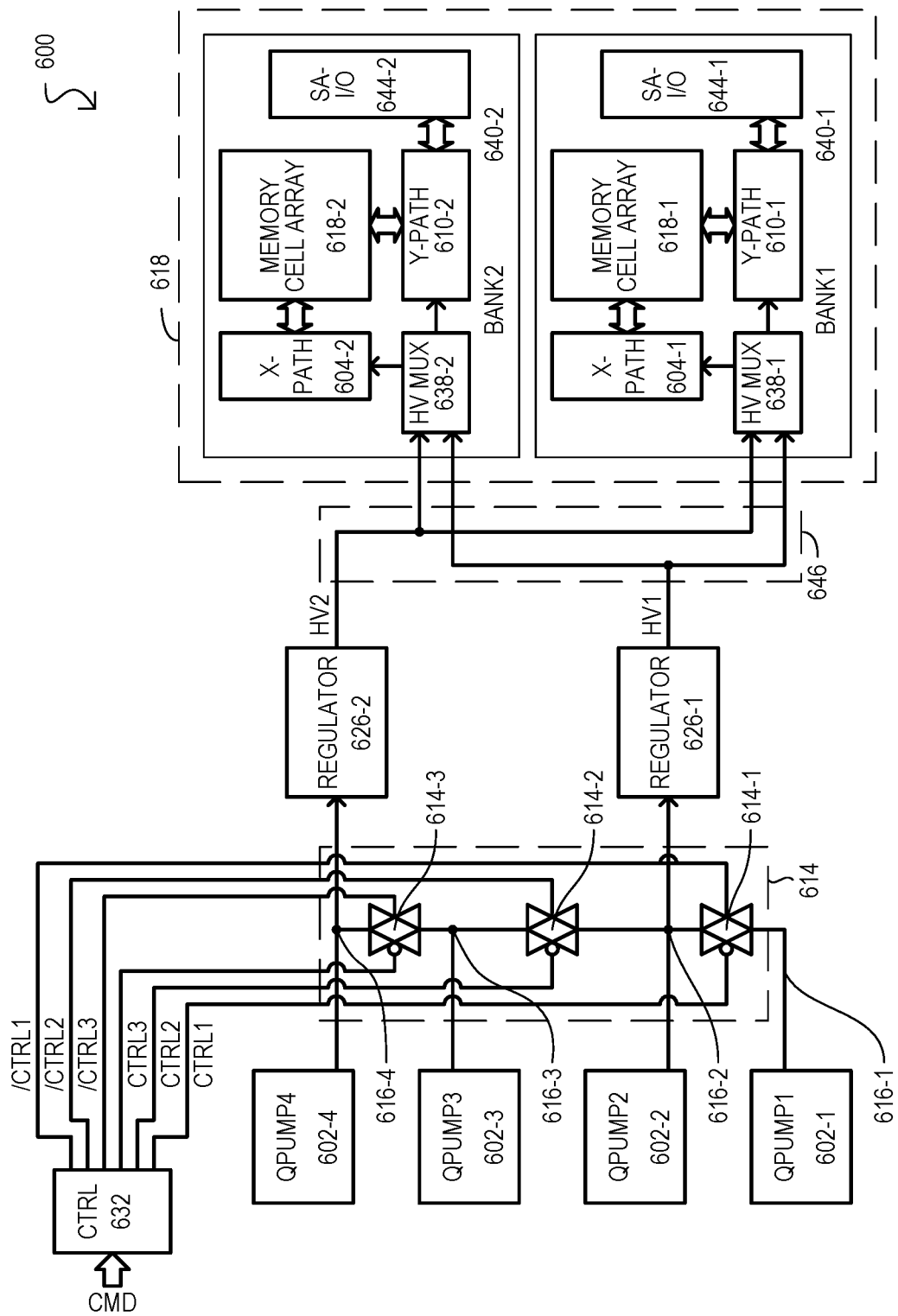
FIG. 6 is a block diagram of a memory device according to another embodiment.

FIG. 6 is a block diagram of a memory device 600 according to another embodiment. A memory device 600 can be one implementation of that shown in FIG. 5. Memory device 600 can include four charge pumps 602-1 to -4, switch circuits 614, a first voltage regulator 626-1, a second voltage regulator 626-2, controller circuits 632, a high voltage (HV) routing network 646, and a memory cell array 618 having a first bank 640-1 and second bank 640-2.

Charge pumps 602-1 to -4 can take the form of any of those described herein or equivalents. In the embodiment shown, each charge pump 602-1 to 602-4 can be connected to a corresponding pump node 616-1 to -4.

Switch circuit 614 can selectively connect or isolate pump nodes (616-1 to -4) from one another. In the embodiment shown, switch circuit 614 can include a first switch 614-1 disposed between first pump node 616-1 and second pump node 616-2, a second switch 614-2 disposed between a second pump node 616-2 and third pump node 616-3, and a third switch 614-3 disposed between a third pump node 616-3 and fourth pump node 616-4. Each switch (614-1 to -3) can be controlled (i.e., can short or isolate its pump nodes) by a corresponding pair of control signals (shown as CTRL1, /CTRL1, CTRL2, /CTRL2, CTRL3, /CTRL3). As will be described in more detail, control of switches (614-1 to -3) can enable various charge pump supply configurations.

Controller circuits 632 can establish the states of control signals (CTRL1 to/CTRL3) to establish a state of each switch 614-1 to -3. Controller circuits 632 can establish states of control signals (CTRL1 to/CTRL3) in a dynamic fashion, a static fashion, or a combination thereof. As but a few of many possible examples, dynamic switching can occur in response to particular instructions received at inputs of the memory device 600. Static control of switches (614-1 to -3) can be established by factory programming (e.g., fuses, anti-fuses, one-time programmable memory cells, protected nonvolatile memory cells, etc.).

A first voltage regulator 626-1 can be connected to second pump node 616-2 and can provide a first regulated high voltage HV1 to HV routing network 646. A second voltage regulator can be connected to fourth pump node 616-4 and can provide a second regulated high voltage HV2 to HV routing network 646.

HV routing network 646 can route outputs of each voltage regulator 626-1/2 to each bank 640-1/2 of memory cell array 618.

Each bank 640-1/2 can include a memory array portion 618-1/2, X-path circuits 604-1/2, Y-path circuits 610-1/2, high voltage multiplexers (MUXs) 638-1/2, and sense amplifier (SA) I/O circuits 644-1/2. Memory array portions 618-1/2 can include nonvolatile memory cells which can be accessed via X-path circuits 604-1/2 and Y-path circuits 610-1/2 as described herein, and equivalents. In some embodiments, memory array portions 618-0/1 can have a NOR "flash" structure. However, alternate embodiments can include any type of nonvolatile memory cell and array architecture as described herein and equivalents. SA I/O circuits 644-1/2 can provide read and write (e.g., program) data paths to enable data to be read from and written into the corresponding memory array portion 618-1/2. It is understood that banks 640-1/2 are separately accessible, enabling accesses of different types to occur in different banks at the same time.

HV MUXs 638-1/2 can selectively connect high voltage values received from HV routing network 646 to various sections of the corresponding bank 640-1/2, including but not limited to X-path circuits 604-1/2 and Y-path circuits 610-1/2.

Referring still to FIG. 6, in some embodiments, switches (614-1 to -3) can be set to isolate charge pumps so that only one charge pump (or group of charge pumps) is used to generate the high voltage for one bank, while a different charge pump (or group of charge pumps) is used to generate the high voltage for another bank.

In a particular embodiment, such isolation of charge pumps can occur in a read-while-write (RWW) operation. A RWW operation can execute a program (or erase) in one bank while reading data from another bank. For example, assume a read operation is to be executed in a first bank 640-1 using high voltage HV1, and at the same time, a program or erase operation is to be executed in a second bank 640-2 using high voltage HV2. Switch 614-2 can be open, isolating pump node 616-2 from 616-3. Charge pump 602-1 and/or 602-2 can then be used to generate HV1, while charge pump 602-3 and/or 603-4 can be used to generate HV2. The isolation of charge pumps can ensure variations HV1 do not disturb HV2, and vice versa.

It is understood that a charge pump switching configuration can take various forms to enable flexible isolation and assignment of charge pumps to meet different types of memory device access and modes of operation. For example, it may be desirable to have greater charge pump strength in a bank when an erase operation is occurring versus when a program operation is occurring. FIGS. 7A to 7H show various possible configurations for a charge pump switching arrangement like that shown in FIG. 6.

FIGS. 7A to 7H are diagrams showing a device 700 having charge pumps (602-1 to -4), corresponding pump nodes (616-1 to -4), switches (614-1 to -3), and first and second voltage regulators (626-1/2). Each of FIGS. 7A to 7H shows a different configuration for switches (614-1 to -3). A label for the resulting high voltage output by the voltage regulators (626-2) includes parentheses showing which charge pumps can source the high voltage.

Figure 7A:
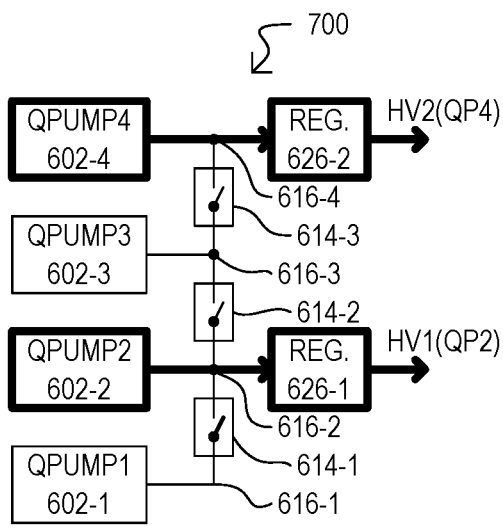
FIGS. 7A to 7H are charge pump switching configurations according to various embodiments.

Referring to FIG. 7A, all switches (614-1 to -3) are open, isolating pump nodes (616-1 to -4) from one another. As a result, HV1 generated by voltage regulator 626-1 is sourced by charge pump 602-2. Thus, an output from voltage regulator 626-1 is shown as HV1(QP2). HV2 generated by voltage regulator 626-2 is sourced by charge pump 602-4. Thus, an output from voltage regulator 626-1 is shown as HV2(QP4).

Figure 7B:
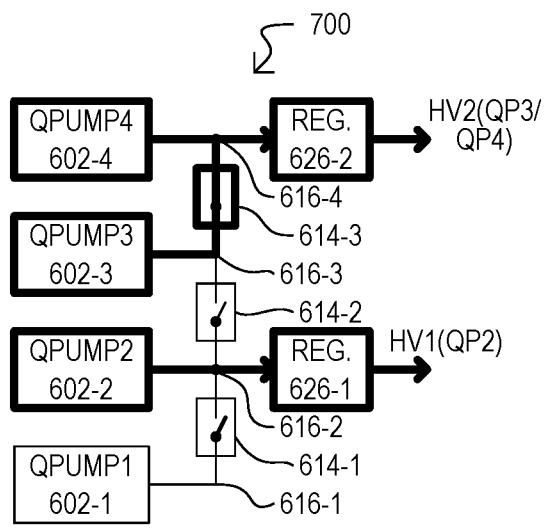
Figure 7C:
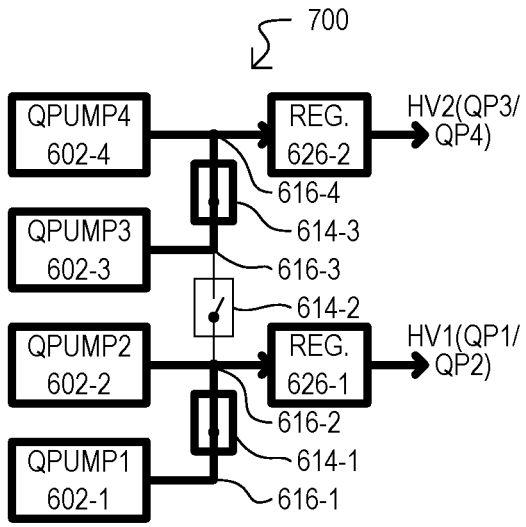
Figure 7D:
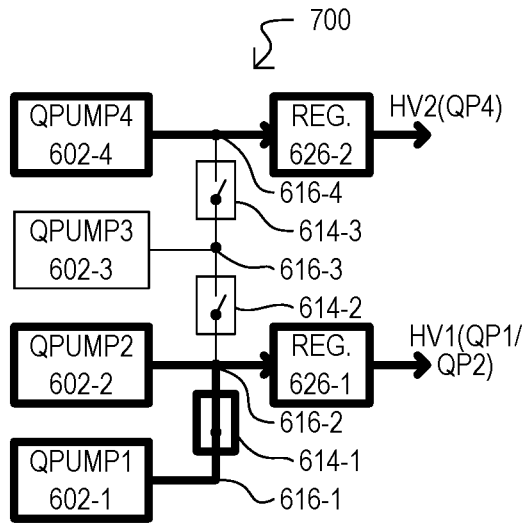
Figure 7E:
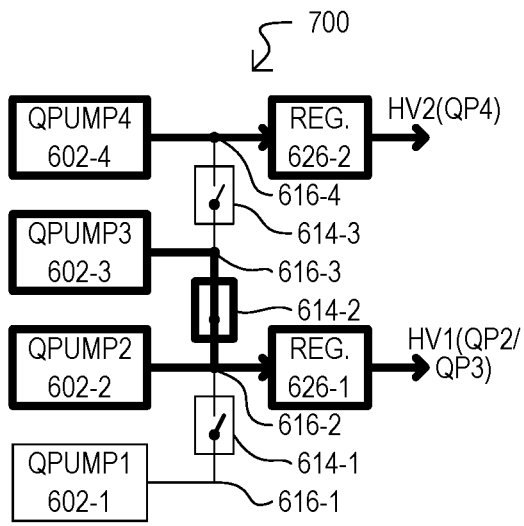
Figure 7F:
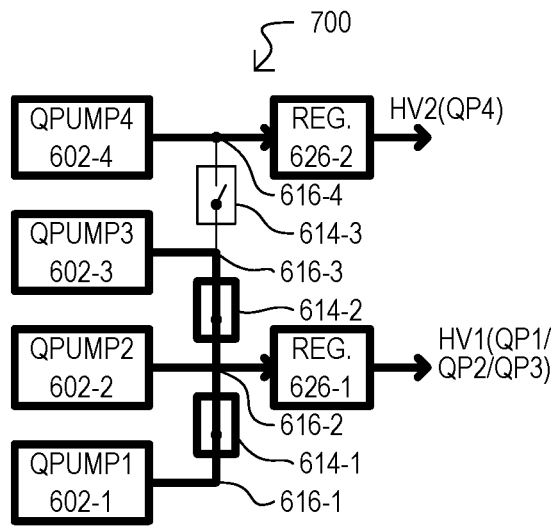

Referring to FIG. 7B, switches 614-1 and 614-2 are open, and switch 614-3 is closed. Thus, pump nodes 616-4 and 616-3 are shorted to one another, while pump nodes 616-2 and 616-2 remain isolated. As a result, HV2 generated by voltage regulator 626-2 can be sourced by charge pump 602-3 and/or 602-4, and so is shown as HV2(QP3/QP4).

The configurations of FIGS. 7C to 7F are understood from the above descriptions. Such configurations show how various assignments of charge pumps to high voltages HV1 and HV2 are possible, while maintaining isolation between the charge pump with respect to the high voltages.

Figure 7G:
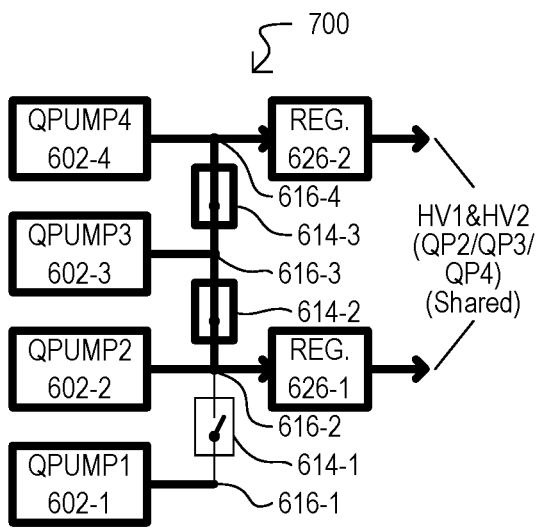
Figure 7H:
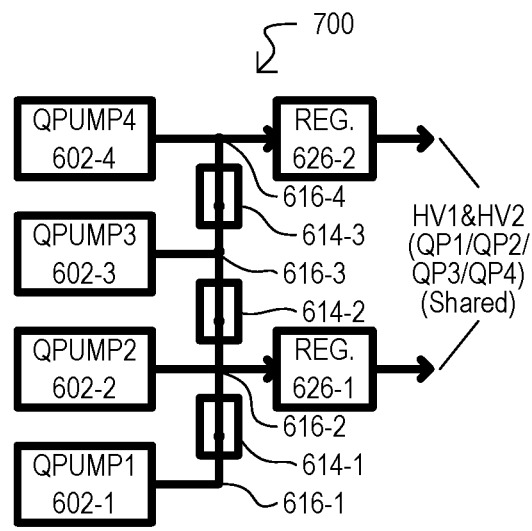

FIGS. 7G and 7H show arrangements where charge pump nodes for the high voltages are not isolated. Thus, FIG. 7G shows an arrangement where charge pumps 602-2 to -4 source a common node formed by switches 614-2 and 614-3 shorting outputs from charge pumps 602-2 to -4. Thus, high voltages HV1 and HV2 can be commonly sourced using charge pumps 602-2 to -4. FIG. 7H shows an arrangement in which all pump nodes are shorted together, thus high voltages HV1 and HV2 are commonly sourced by all charge pumps.

It is understood that in addition to connections made by switches (614-1 to -3), additional variation can be enabled by controlling charge pumps individually. Any of charge pumps (602-1 to -4) could be selectively enabled or disabled. For example, while FIG. 7B shows an arrangement where HV2 can be sourced by charge pumps 602-3/4, in such an arrangement, either of charge pumps 602-3/4 could be disabled, to source HV2 with one charge pump. Similarly, any of charge pumps (602-1 to -4) could have their performance adjusted. For example, a sourcing capacity and/or output voltage could be adjusted.

It is also understood that the particular charge pump switching configurations shown in the embodiments should not be construed as limiting. Alternate embodiments can include greater of fewer number of charge pumps, greater of fewer number of switches, and/or different switch arrangements, including switches in parallel to one another with respect to the pump nodes.

Figure 8A:
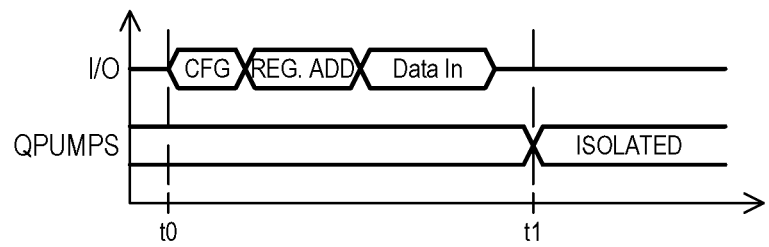
FIGS. 8A and 8B are timing diagrams showing operations according to further embodiments.
Figure 8B:
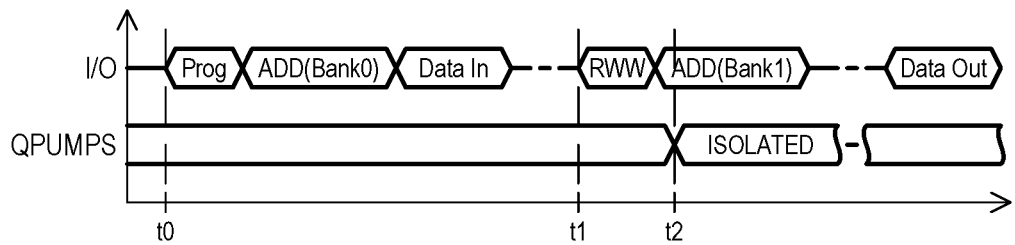

FIGS. 8A and 8B are timing diagrams showing the initiation of various operations in a memory device according to further embodiments.

FIGS. 8A and 8B include the waveform I/O, which shows control and data inputs to a memory device, and QPUMPS, which shows a status of charge pumps. More particularly, QPUMPS shows if charge pumps are isolated from one another to ensure that activities using the high voltage of one charge pump (or group of charge pumps) do not disturb the high voltage of another charge pump (or group of charge pumps).

Referring still to FIG. 8A, at about time t0, a device configuration operation can be initiated by application of a configuration command at inputs of the memory device. In the embodiment shown, the configuration command can include a register address (REG. ADD) and register data (Data In).

At about time t1, in response to configuration command, charge pumps can be isolated from one another, enabling one high voltage to be generated with one charge pump (or set of charge pumps), while another high voltage is generated with a different charge pump (or different set of charge pumps).

It is understood that while FIG. 8A shows a configuration command that includes writing to a register, alternate embodiments can include receiving only a command (e.g., an opcode is dedicated to isolating charge pumps).

Referring to FIG. 8B, a device configuration operation can occur in response to accesses to different banks of a memory device at the same time. At about time to, a memory device can receive a command to program (or erase) cells in one bank. In the embodiment shown, the command is accompanied by an address (ADD(Bank0)) and write data (Data In).

At about time t1, the memory device can receive another command to read cells in a different bank. It is understood that the programming operation initiated at time t0 is still underway at time t1. In the embodiment shown, the command is accompanied by an address (ADD(Bank1)).

At about time t2, in response to the second access to a different bank (i.e., read to Bank 1), charge pumps can be separated from one another. Thus, high voltage used in a program/erase operation to Bank0 will not disturb a high voltage used in the read operation to Bank1, and vice versa.

It is understood that the manner by which commands are applied to a memory device can vary as noted for FIGS. 4A to 4C (e.g., command and data can be received in parallel, separate command/data buses, etc.).

While the embodiments above have described various methods in conjunctions with systems and described operations, additional methods will now be described.

Figure 9:
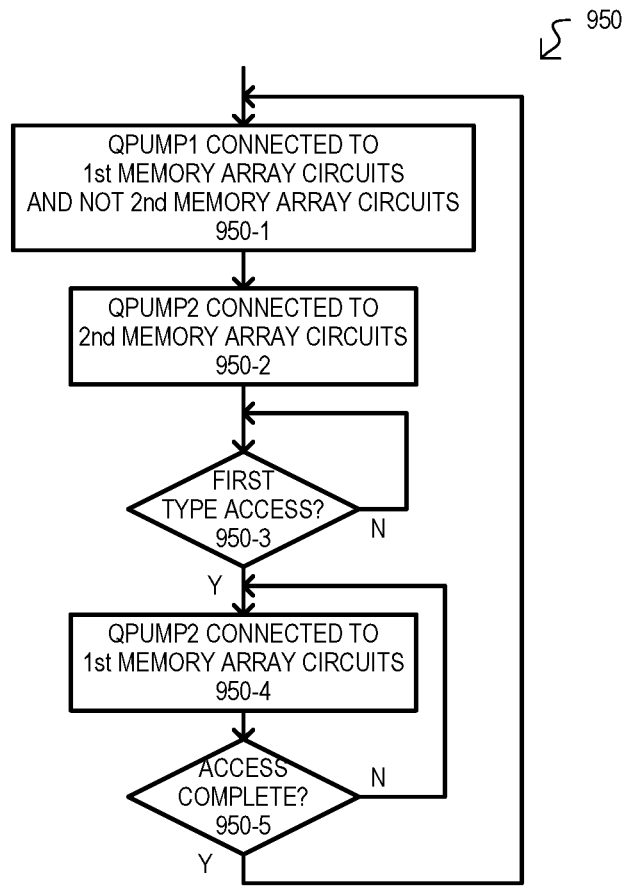
FIG. 9 is a flow diagram of a method according to an embodiment.

FIG. 9 is a flow diagram of a method 950 according to an embodiment. A method 950 can include establishing an initial charge pump configuration in a memory device, in which a first charge pump QPUMP1 can be connected to first memory array circuits and not connected to (e.g., isolated from) second memory array circuits 950-1. Further, a second charge pump QPUMP2 can be connected to the second memory array circuits 950-2.

A method 950 can determine if a memory device is to execute a first type access 950-3. If a first type of access does not occur (N from 950-3), a method 950 can remain in the initial configuration established by 950-1/2 and continue to determine if a first type access occurs 950-3.

If a first type of access does occur (Y from 950-3), a method 950 can change the charge pump configuration by connecting the second charge pump QPUMP2 to the first memory array circuits 950-4. While the first type of access is occurring (N from 950-5), a method 950 can continue to connect QPUMP2 to the first memory array circuits 950-4.

When the first type of access is complete (Y from 950-5), a method 950 can return to the initial configuration 950-1.

Figure 10:
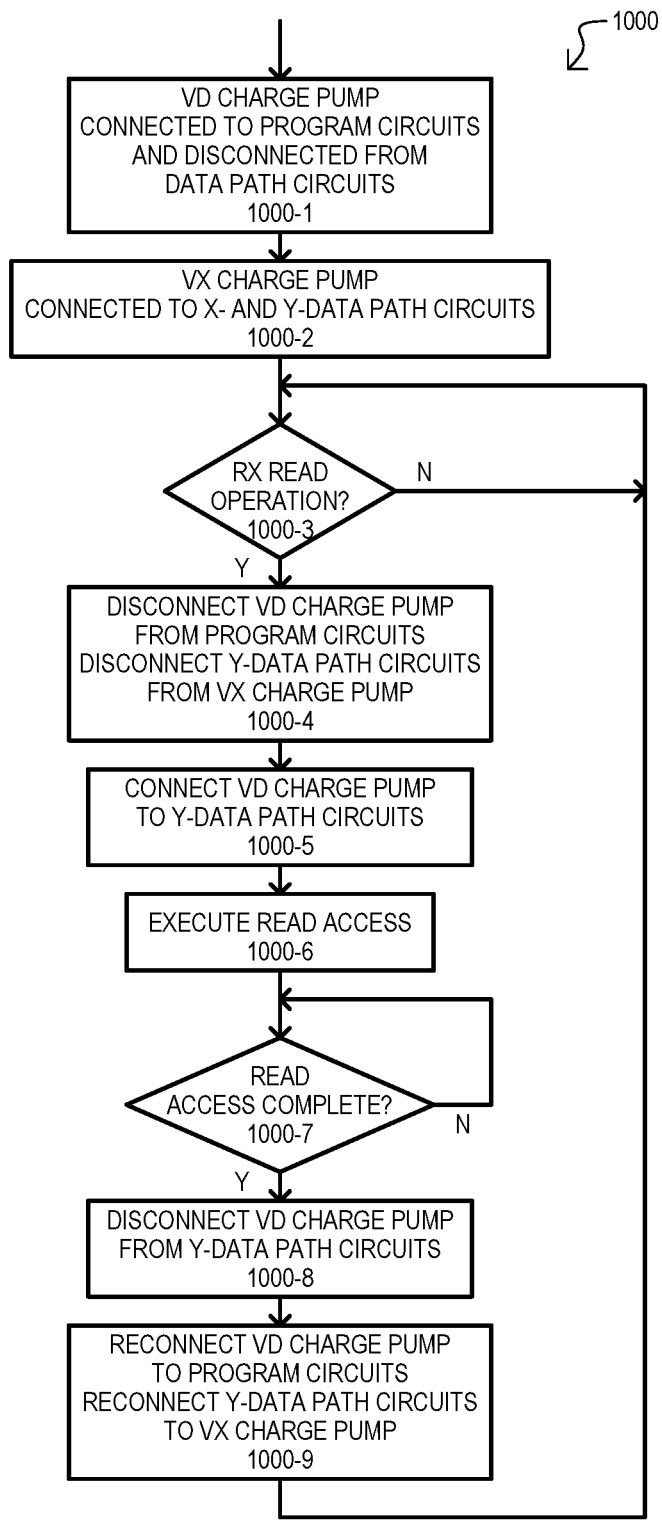
FIG. 10 is a flow diagram of a method according to another embodiment.

FIG. 10 is a flow diagram of a method 1000 according to another embodiment. A method 1000 can be executed by a memory device having a first charge pump (VD charge pump), a second charge pump (VX charge pump), X-data path circuits, Y-data path circuits, and program circuits. X-data path circuits can enable access to a memory cell array in a first direction (e.g., row direction) and Y-data path circuits can enable access to a memory cell array in another direction (e.g., column direction). Program circuits can program nonvolatile memory cells to a particular logic state.

A method 1000 can include connecting charge pumps in a first configuration, with the VD charge pump connected to program circuits and disconnected from data path circuits 1000-1. In addition, VX charge pump can be connected to the data path circuits (both X- and Y data path circuits) 1000-2. Accordingly, program circuits can use a programming voltage generated with VD charge pump while data path circuits can use a high voltage generated with VX charge pump.

A method 1000 can determine if a command for a read operation is received 1000-3. If such a command is not received (N from 1000-3), a method 1000 can continue determining if such a command is received.

If a command for a read operation is received (Y from 1000-3), a method 1000 can disconnect the VD charge pump from the program circuits and disconnect the Y-data path circuits from the VX charge pump 1000-4. A method 1000 can then connect the VD charge pump to the Y-data path circuits 1000-5. Once this new charge pump configuration is established, a method 1000 can execute the read operation 1000-6.

Once a read operation is complete (Y from 1000-7), a method 1000 can return to the first charge pump configuration. The VD charge pump can be disconnected from the Y-data path circuits 1000-8. The VD charge pump can be reconnected to the program circuits, and the Y-data path circuits can be reconnected to the VX charge pump 1000-9. A method 1000 can then return to 1000-3.

Figure 11:
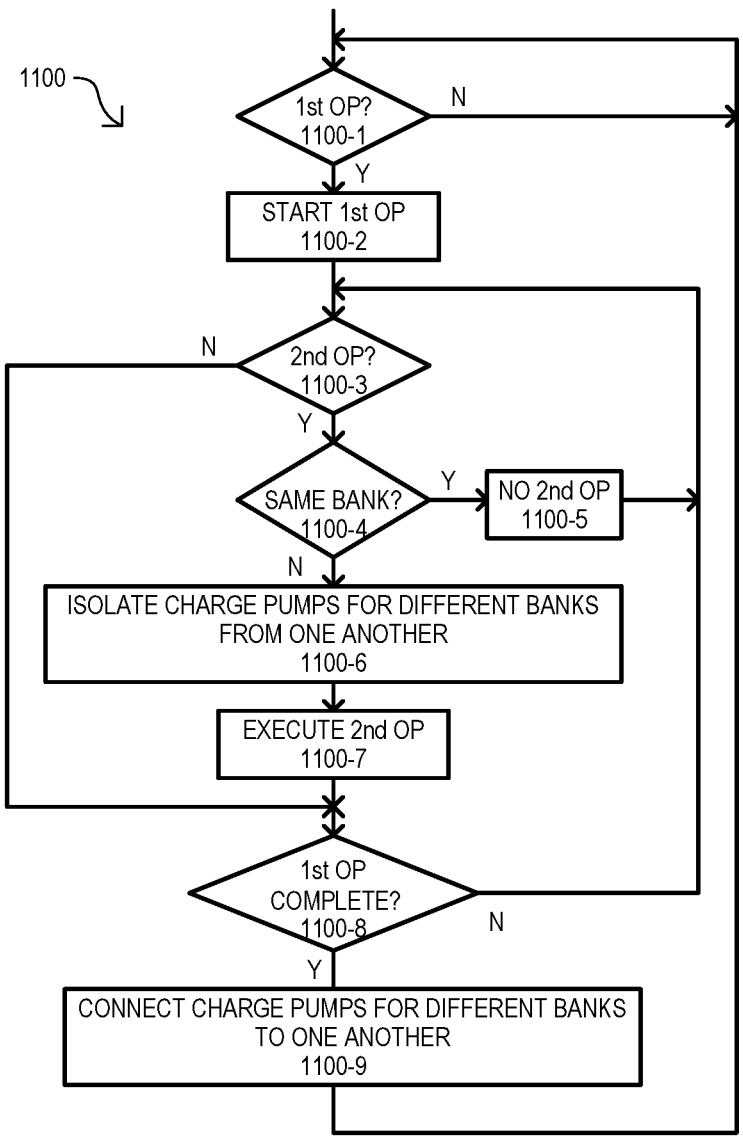
FIG. 11 is a flow diagram of a method according to another embodiment.

FIG. 11 is a flow diagram of a method 1100 according to another embodiment. A method 1100 can be executed by a memory device having a multiple charge pumps that can be connected to multiple banks by a switching circuit.

A method 1100 can include determining if a first type of operation is to occur 1100-1. In some embodiments, such an action can include decoding a command received at inputs of a memory device. As but a few examples, a first operation can be a read operation or a write (including program/erase) operation.

If a first operation is to occur (Y from 1100-1), a method 1100 can start the first operation 1100-2.

While the first operation is being executed, method 1100 can determine if a second operation is to occur 1100-3. Such an action can include those noted for 1100-1. In some embodiments, a second operation can be an operation different from the first operation. That is, if the first operation is a read operation, a second operation can be write operation, and vice versa.

If a second operation is not to occur (N from 1100-3), a method 1100 can determine if the first operation is completed 1100-8. If a first operation is not complete (N from 1100-8), a method 1100 can continue checking for a second operation 1100-3.

If a second operation is to occur (Y from 1100-3), a method 1100 can determine if it is to the same bank as the first operation 1100-4. If the second operation is to the same bank (Y from 1100-4), the second operation may not be executed 1100-5, and a method 1100 can return to checking for another operation 1100-2.

If the second operation is not to the same bank (N from 1100-4), a method 1100 can isolate charge pumps for different banks from one another 1100-6. Such an action can include operating switch circuits to isolate the outputs of charge pumps from one another. Accordingly, high voltages generated for the first operation (occurring in one bank) will not disturb high voltages in the second operation (occurring in a different bank), and vice versa. The second operation can then be executed 1100-7.

When the first operation is complete (Y from 1100-8), a method 1100 connect the charge pumps into a different configuration. In the embodiment shown, this can include connecting charge pumps for the different banks to one another 1100-9. A method 1100 can then return to monitoring for a first operation 1100-1.

Figure 12:
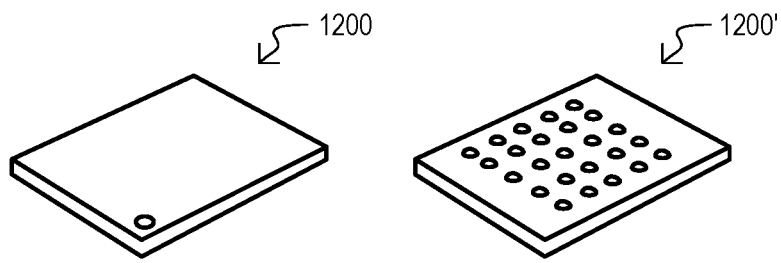
FIG. 12 are diagrams of a memory device according to an embodiment.

Embodiments can take any suitable physical form, and in some embodiments, can include devices formed in a single integrated circuit package. One such example is shown in FIG. 12. FIG. 12 shows a memory device in a top view 1200 and bottom view 1200'. An integrated circuit device 1200 can include a single die or multiple dice, having the circuits described for the various embodiments herein. Further, memory device 1200/1200' can execute any of the methods described herein and equivalents. An integrated circuit device 1200 can be a memory device having a primary function of storing data in a nonvolatile format for use by other devices of a system. However, other embodiments can include memory devices embedded in a larger integrated circuit having additional functions.

Figure 13:
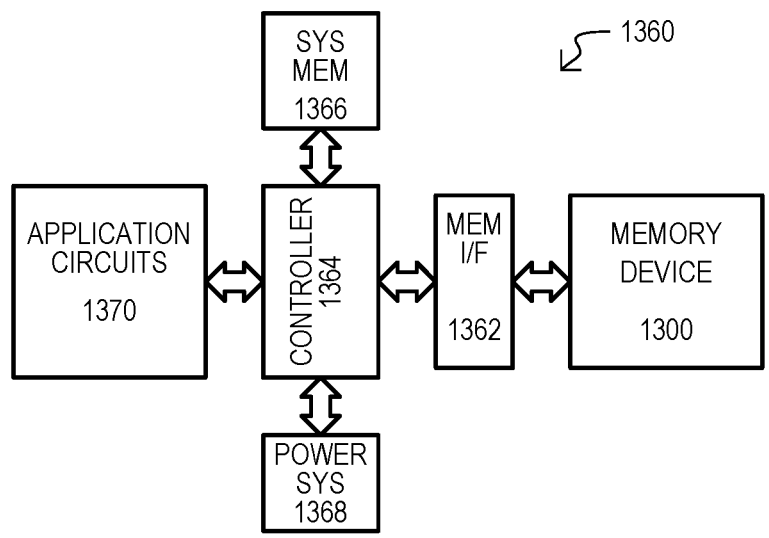
FIG. 13 is a diagram of a system according to an embodiment.
Figure 14:
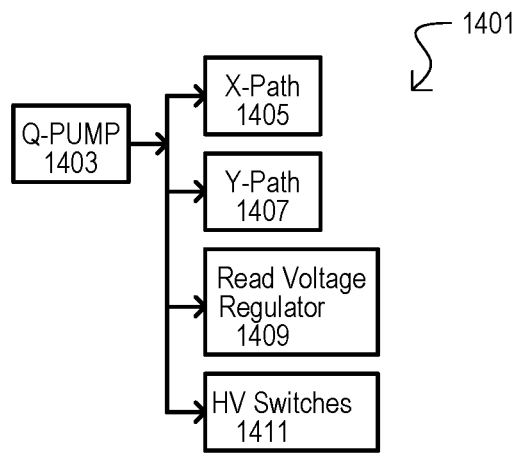
FIG. 14 is a block diagram of a conventional nonvolatile memory device.
Figure 15A:
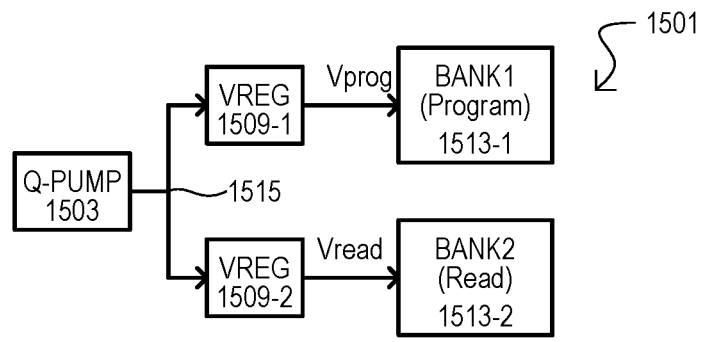
FIG. 15A is a block diagram of another conventional memory device.
Figure 15B:
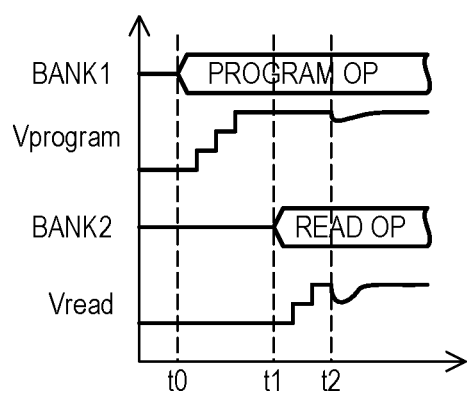
FIG. 15B is a timing diagram showing a disturb operation in the conventional memory device of FIG. 15A.

FIG. 13 is a block diagram of a system 1360 according to another embodiment. A system 1360 can include a memory device 1300, a memory interface 1362, a controller 1364, a system memory 1366, a power system 1368, and application circuits 1370. A memory device 1300 can take the form of any of those described herein or equivalents.

A memory interface 1362 can enable controller 1364 to access memory device 1300 to store and retrieve data. In some embodiments, a memory interface 1362 can be a serial interface. However, alternate embodiments can include any interface suitable to the memory device 1300.

A controller 1364 can include one or more processing circuits for controlling operations of the system 1360. In some embodiments, controller 1364 can execute instructions stored in memory system 1366. Memory system 1366 can include both volatile and nonvolatile memory for use by controller 1364. A power system 1364 can provide power to various portions of the system and can be controlled by controller 1364. In particular embodiments, controller 1364, memory system 1366 and power system 1368 can be part of a same microcontroller device.

Application circuits 1370 can provide predetermined functions for the system 1360. In some embodiments, a system 1360 can be an Internet-of-Things (IoT) device, and application circuits 1370 can include communication circuits for enabling wireless communications via one or more different protocols.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising:
   a plurality of banks, each bank including a memory cell array of nonvolatile (NV) memory cells;
   a plurality of charge pumps, including a first charge pump and second charge pump; and
   a switch circuit configured to
      in a first mode,
         connect a first pump output node of the first charge pump to X-path circuits and Y-path circuits of the banks and
         isolate a second pump output node of the second charge pump from the Y-path circuits and connect the second pump output node to program circuits, and
      in a second mode,
         isolate the first pump output node from the Y-path circuits while connecting the first pump output node to the X-path circuits and
         connect the second pump output node to the Y-path circuits and the program circuits; wherein
   the program circuits are configured to program the NV memory cells to at least one state.

2. The memory device of claim 1, wherein:
   the second mode includes a read operation;
   the first mode includes at least a program operation; and
   the second charge pump generates a program voltage in the program operation.

3. The memory device of claim 1, wherein:
   the switch circuit includes
      a first switch disposed between the first pump output node and the second pump output node,
      the output of the first charge pump is electrically coupled to a first bank of the plurality of banks, and
      the output of the second charge pump is electrically coupled to a second bank of the plurality of banks.

4. The memory device of claim 3, wherein the first switch is configured to connect the outputs of the first and second charge pumps to one another in the first mode, and isolate the outputs of the first and second charge pumps from one another in the second mode.

5. The memory device of claim 3, wherein:
the plurality of charge pumps further includes a third charge pump; and
the switch circuit further includes a second switch disposed between the second pump output node and an output of the third charge pump.

6. The memory device of claim 1, wherein the second mode includes a first type operation to the second bank while a second type operation is occurring in the first bank.

7. A system, comprising:
at least one nonvolatile memory cell array including first circuits and second circuits;
a plurality of charge pumps, including a first charge pump with a first pump output and a second charge pump with a second pump output; and
a switch circuit, disposed between the charge pumps and the at least one nonvolatile memory cell array, and configurable into at least a first state and a second state in response to configuration data,
the first state conductively connecting the first and second pump outputs to form a common node that enables current paths between the common node and the first and second circuits, and
the second state electrically isolating the first and second pump outputs, including
disabling the current path between the first pump output and the second circuits while enabling the current path between the first pump output and the first circuits and
disabling the current path between the second pump output and the first circuits while enabling the current path between the second pump output and the second circuits.

8. The system of claim 7 further including control circuits for generating the configuration data in response to control input values.

9. The system of claim 8 wherein the control circuits generate configuration data for the second state in response to a control input value indicating a read operation.

10. The system of claim 7, wherein:
the first circuits are Y-path circuits for selectively connecting bit lines of the nonvolatile memory cell array to an input or output data path;
the second circuits are program circuits configured program memory cells between states;
the first charge pump provides a first voltage; and
the second charge pump provides a second voltage; wherein
in a program operation to a first bank of the nonvolatile memory cell, the system has the second state, and a current path between the second charge pump and the Y-path circuits is disabled, and the second charge pump provides a program voltage for the first bank, and
in a read operation to the first bank, the system has the second state, and a current path between the second charge pump and the Y-path circuits is enabled.

11. The system of claim 7, wherein:
the at least one nonvolatile memory cell array includes a plurality of banks, each bank including nonvolatile memory cell array and access circuits for the nonvolatile memory cell array; and
the control circuits generate configuration data for the second state in response to a control input value indicating a first type operation to one bank while another bank is undergoing a second type operation.

12. The system of claim 7, further including register circuits for storing control input values received at input terminals, the register circuits providing the configuration data to the switch circuit.

13. The system of claim 7, further including:
the first charge pump provides a first voltage at a first pump node;
the second charge pump provides a second voltage at a second pump node; and
a plurality of voltage regulator circuits, including a first voltage regulator circuit coupled to the first pump node and a second voltage regulator coupled to the second pump node.

14. A method, comprising:
by operation of switch circuits,
connecting a first charge pump to first memory array circuits and second memory array circuits, first charge pump being disconnected from third memory array circuits, and
connecting a second charge pump to third memory array circuits and disconnecting the second charge pump from the first memory array circuits; and
in response to first configuration data, by operation of the switch circuits, isolating the first charge pump from the first memory array circuits while the first charge pump remains connected to the second memory array circuits and connecting the second charge pump to the first memory array circuits; wherein
the switch circuits, first and second charge pumps, and first, second and third memory array circuits are formed in a same substrate of a nonvolatile memory (NVM) integrated circuit (IC) device.

15. The method of claim 14, further including:
the first memory array circuits are Y-path circuits for selectively connecting bit lines of a NVM cell array to an input or output data path of the NVM IC device;
the first configuration data indicates a read operation;
in a non-read operation,
connecting the first charge pump to the Y-path circuits, and
connecting the second charge pump to program circuits for programming NVM cells while isolating the second charge pump from the Y-path circuits; and
in the read operation,
isolating the first charge pump from the Y-path circuits, and
connecting the second charge pump to the Y-path circuits.

16. The method of claim 14, wherein:
the NVM IC device includes a plurality of banks; and
generating the configuration data in response to executing a first type operation in one bank while executing a second type operation in another bank.

* * * * *